United States Patent
Verma et al.

(10) Patent No.: US 11,127,700 B1
(45) Date of Patent: Sep. 21, 2021

(54) INTEGRATED CIRCUIT DEVICE

(71) Applicant: UNITED MICROELECTRONICS CORP., Hsin-Chu (TW)

(72) Inventors: Purakh Raj Verma, Singapore (SG); Kuo-Yuh Yang, Hsinchu County (TW); Chia-Huei Lin, Hsinchu (TW); Chu-Chun Chang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/886,721

(22) Filed: May 28, 2020

(51) Int. Cl.
| | |
|---|---|
| *H01L 23/66* | (2006.01) |
| *H01L 23/00* | (2006.01) |
| *H01L 23/522* | (2006.01) |
| *H01L 23/532* | (2006.01) |

(52) U.S. Cl.
CPC .......... *H01L 23/66* (2013.01); *H01L 23/5223* (2013.01); *H01L 23/5226* (2013.01); *H01L 23/53228* (2013.01); *H01L 23/564* (2013.01); *H01L 24/05* (2013.01); *H01L 2223/6661* (2013.01); *H01L 2224/05624* (2013.01)

(58) Field of Classification Search
CPC ............... H01L 23/564; H01L 23/5226; H01L 23/5223; H01L 23/53228; H01L 23/26; H01L 23/66; H01L 51/5259; H01L 51/5237; H01L 51/5253; H01L 24/05; H01L 2223/6661; H01L 2224/05624
USPC ....... 257/532, 347, 409, 484, 620, 630, 758, 257/774, E21.244, E21.523, E21.575, 257/E21.598, E21.599, E23.002, E23.116, 257/E23.141, E23.142, E23.167, E23.194; 438/121, 460, 400, 666, 734
See application file for complete search history.

(56) References Cited

U.S. PATENT DOCUMENTS

| | | | |
|---|---|---|---|
| 6,566,735 B1 | 5/2003 | Minn | |
| 7,223,673 B2 | 5/2007 | Wang | |
| 7,279,775 B2 | 10/2007 | Kim | |
| 7,622,364 B2 * | 11/2009 | Adkisson | H01L 23/562 438/462 |
| 9,679,896 B2 * | 6/2017 | Yoon | H01L 29/402 |
| 2005/0026397 A1 * | 2/2005 | Daubenspeck | H01L 21/76838 438/465 |
| 2010/0006984 A1 * | 1/2010 | Watanabe | H01L 23/562 257/639 |
| 2018/0033891 A1 * | 2/2018 | Pu | H01L 29/42384 |

* cited by examiner

*Primary Examiner* — Dao H Nguyen
(74) *Attorney, Agent, or Firm* — Winston Hsu

(57) ABSTRACT

An integrated circuit device includes a substrate and an integrated circuit area on the substrate. The integrated circuit area includes a dielectric stack. A cap layer is disposed on the dielectric stack. A seal ring is disposed in the dielectric stack and around a periphery of the integrated circuit area. A trench is formed around the seal ring to expose a sidewall of the dielectric stack. A MIM capacitor including a CTM layer and a CBM layer is disposed on the dielectric stack. A moisture blocking layer continuously covers the integrated circuit area and the MIM capacitor. The cap layer is interposed between the CTM layer and the CBM layer of the MIM capacitor and functions as a capacitor dielectric layer of the MIM capacitor. The moisture blocking layer extends to the sidewall of the dielectric stack, thereby sealing a boundary between two adjacent dielectric films in the dielectric stack.

29 Claims, 9 Drawing Sheets

INTEGRATED CIRCUIT DEVICE

BACKGROUND OF THE INVENTION

1. Field of the Invention

The present invention relates to the field of semiconductor technology, and in particular to an improved integrated circuit device and a method of manufacturing the same.

2. Description of the Prior Art

Seal ring formation is an important part in the back-end of semiconductor processes. Seal rings are stress protection structures around integrated circuits, protecting the internal circuit inside semiconductor chips from damage caused by the dicing of the semiconductor chips from wafers.

Another function of the seal ring is to protect the integrated circuits on the inner side of seal ring from moisture-induced degradation. Since dielectric layers of the integrated circuits are typically formed of porous low-k dielectric materials, moisture can easily penetrate through low-k dielectric layer to reach the integrated circuits.

Conventional seal rings are electrically continuous around the periphery of a die, and the direct electrical path around the periphery of the die can transfer noise to sensitive analog and RF blocks, which is undesirable. One conventional solution to prevent noise transfer is the use of electrically discontinuous seal ring, thereby inhibiting a significant portion of the noise transfer. However, the discontinuities of the seal ring allow for penetration of the semiconductor die by harmful moisture and other contaminants.

SUMMARY OF THE INVENTION

One object of the present invention is to provide an improved integrated circuit device to solve the above-mentioned shortcomings and shortcomings of the prior art.

One aspect of the invention provides an integrated circuit device including a substrate and an integrated circuit area on the substrate. The integrated circuit area includes a dielectric stack. A cap layer is disposed on the dielectric stack. A seal ring is disposed in the dielectric stack and around a periphery of the integrated circuit area. A trench is formed around the seal ring to expose a sidewall of the dielectric stack. A metal-insulator-metal (MIM) capacitor including a capacitor top metal (CTM) layer and a capacitor bottom metal (CBM) layer is disposed on the dielectric stack. A moisture blocking layer continuously covers the integrated circuit area and the MIM capacitor. The cap layer is interposed between the CTM layer and the CBM layer of the MIM capacitor and functions as a capacitor dielectric layer of the MIM capacitor. The moisture blocking layer extends to the sidewall of the dielectric stack, thereby sealing a boundary between two adjacent dielectric films in the dielectric stack. A passivation layer is disposed over the moisture blocking layer.

According to some embodiments, the integrated circuit area comprises a radio-frequency (RF) circuit region.

According to some embodiments, the substrate is a silicon-on-insulator (SOI) substrate comprising a lower substrate, a buried oxide layer on the lower substrate, and a device layer on the buried oxide layer.

According to some embodiments, the device layer comprises a silicon layer.

According to some embodiments, the seal ring is electrically coupled to the lower substrate with a through contact that penetrates through the device layer and the buried oxide layer.

According to some embodiments, the two adjacent dielectric films are two adjacent low-dielectric constant (low-k) dielectric films.

According to some embodiments, the seal ring is a discontinuous seal ring.

According to some embodiments, the seal ring is composed of interconnected metal lines and vias.

According to some embodiments, the metal lines comprise a topmost copper metal layer.

According to some embodiments, the topmost copper metal layer is a topmost damascene copper layer, and wherein the CBM layer is coplanar with the topmost damascene copper layer.

According to some embodiments, the integrated circuit device further comprises a topmost inter-layer dielectric (ILD) film covering the moisture blocking layer and the MIM capacitor; a topmost via layer penetrating through the topmost ILD film and the moisture blocking layer to electrically connect with the topmost copper metal layer; and an aluminum pad disposed on and electrically connected to the topmost via layer.

According to some embodiments, the passivation layer covers a periphery of the aluminum pad and a top surface of the topmost ILD film.

According to some embodiments, the topmost ILD film comprises silicon oxide.

According to some embodiments, the passivation layer comprises polyimide or silicon oxide.

According to some embodiments, the moisture blocking layer comprises silicon nitride, silicon oxynitride, or silicon carbonitride.

Another aspect of the invention provides an integrated circuit device including a substrate and an integrated circuit area on the substrate. The integrated circuit area includes a dielectric stack. A seal ring is disposed in the dielectric stack and around a periphery of the integrated circuit area. A trench is disposed around the seal ring and exposing a sidewall of the dielectric stack. The trench is disposed within a scribe line. A moisture blocking layer is disposed on the sidewall of the dielectric stack, thereby sealing a boundary between two adjacent dielectric films in the dielectric stack. The moisture blocking layer is a composite layer comprising a silicon oxide layer and a silicon nitride layer on the silicon oxide layer.

According to some embodiments, the integrated circuit area comprises a radio-frequency (RF) circuit.

According to some embodiments, the substrate is a silicon-on-insulator (SOI) substrate comprising a lower substrate, a buried oxide layer on the lower substrate, and a device layer on the buried oxide layer.

According to some embodiments, the device layer comprises a silicon layer.

According to some embodiments, the seal ring is electrically coupled to the lower substrate with a through contact that penetrates through the device layer and the buried oxide layer.

According to some embodiments, the two adjacent dielectric films are two adjacent low-dielectric constant (low-k) dielectric films.

According to some embodiments, the seal ring is a discontinuous seal ring.

According to some embodiments, the seal ring is composed of interconnected metal lines and vias.

According to some embodiments, the metal lines comprise a topmost copper metal line.

According to some embodiments, the topmost copper metal line is a topmost damascene copper layer.

According to some embodiments, the integrated circuit device further comprises a topmost dielectric film over the dielectric stack; a topmost via layer penetrating through the topmost dielectric film to electrically connect with the topmost copper metal layer; and an aluminum pad disposed on and electrically connected to the topmost via layer.

According to some embodiments, the integrated circuit device further comprises a passivation layer covering a periphery of the aluminum pad and a top surface of the topmost dielectric film.

According to some embodiments, the topmost dielectric film comprises silicon oxide.

According to some embodiments, the passivation layer comprises polyimide or silicon oxide.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
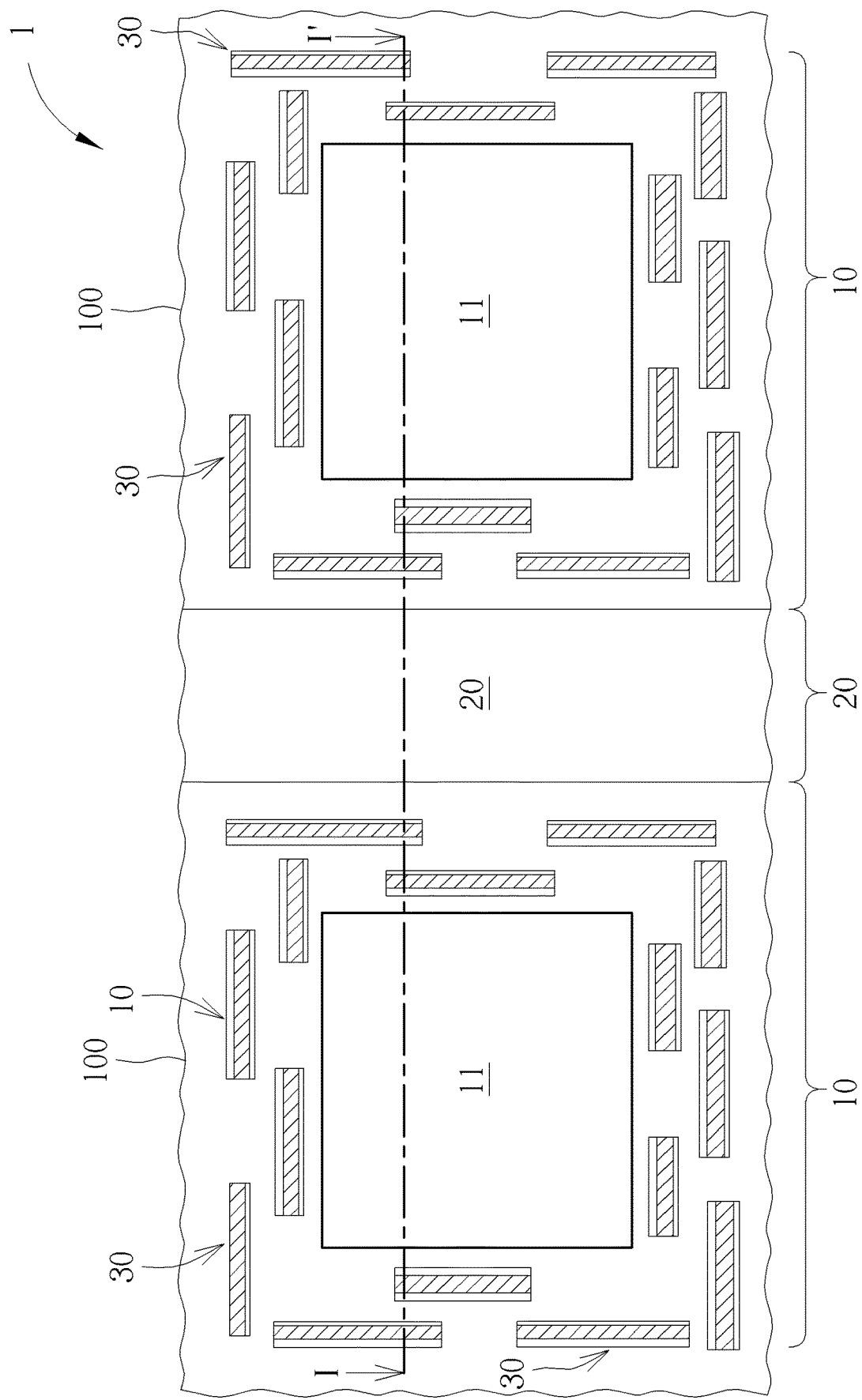
FIG. 1 to FIG. 5 are schematic diagrams showing an exemplary method for forming an integrated circuit device with a seal ring according to an embodiment of the present invention.

Please refer to FIG. 1 to FIG. 5. FIG. 1 to FIG. 5 are schematic diagrams showing an exemplary method for forming an integrated circuit device 1 with a seal ring according to an embodiment of the present invention. FIG. 1 is a schematic top view of the integrated circuit device 1. FIG. 2 to FIG. 5 are cross-sectional views taken along line I-I' of FIG. 1.

Figure 2:
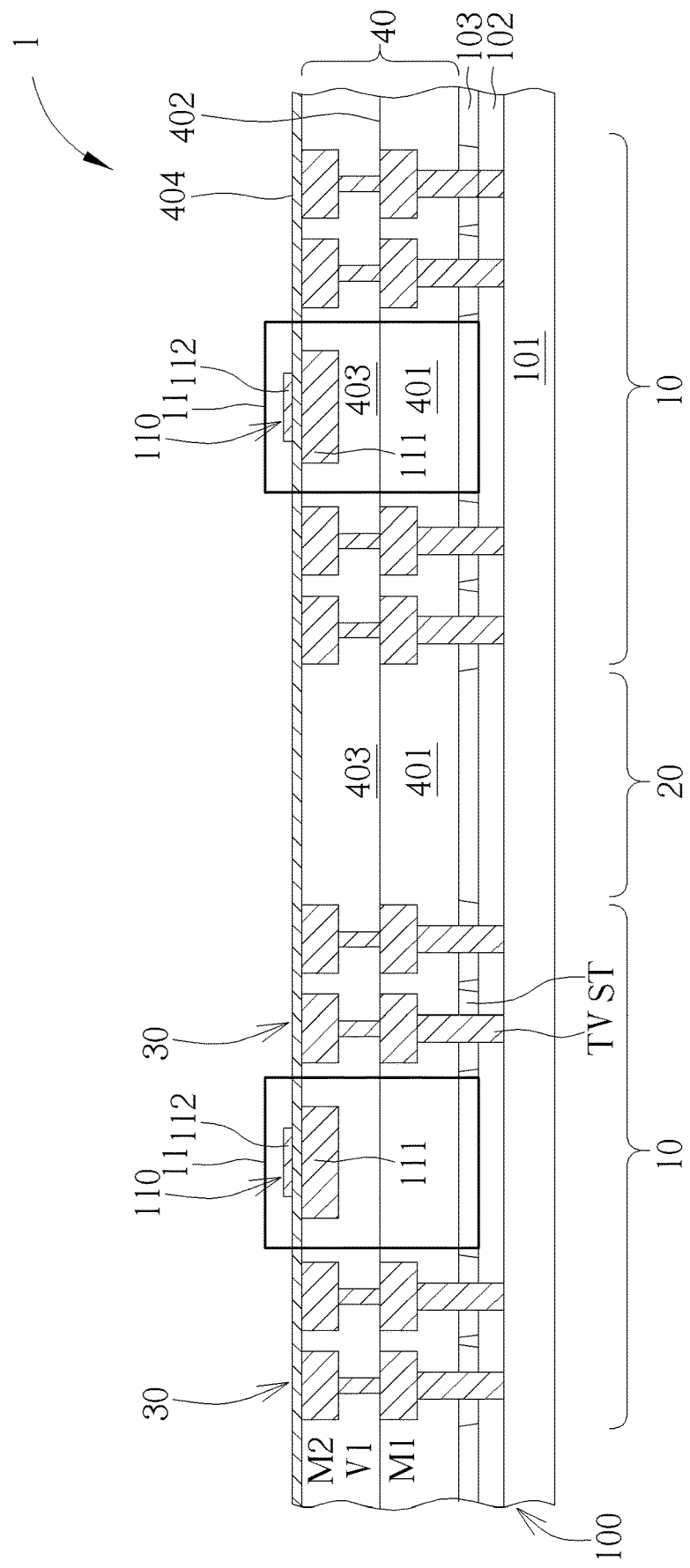

As shown in FIG. 1 and FIG. 2, a substrate 100 such as a semiconductor substrate is first provided. For example, the substrate 100 may be a silicon-on-insulator (SOI) substrate, including a lower substrate 101, a buried oxide layer 102 on the lower substrate 101, and a device layer 103 on the buried oxide layer 102. The lower substrate 101 may be a silicon substrate, the buried oxide layer 102 may be a silicon oxide layer, and the device layer 103 may be a silicon layer, for example, a single crystalline silicon layer.

According to an embodiment of the invention, at least one integrated circuit area 10 is formed on the substrate 100. For the sake of simplicity, two exemplary integrated circuit areas 10 are shown in the figures. According to an embodiment of the invention, each of the two integrated circuit areas 10 comprises a radio frequency (RF) circuit region 11. For the sake of simplicity, the circuit elements and metal interconnection structure of the integrated circuit areas 10 are not shown in FIG. 2. According to an embodiment of the invention, a scribe line area 20 is provided between the integrated circuit areas 10.

According to an embodiment of the invention, each integrated circuit area 10 comprises a dielectric stack 40. According to an embodiment of the invention, a structurally and electrically discontinuous sealing ring 30 is disposed in the dielectric stack 40, and the sealing ring 30 is disposed around the periphery of the integrated circuit area 10. The sealing ring 30 can protect the RF circuit region 11 from damage caused by wafer sawing. The electrically discontinuous sealing ring 30 can suppress noise transmission. However, due to the structural discontinuity of the sealing ring 30, its ability to block moisture or contaminants from penetrating into the RF circuit region 11 is reduced. The present invention addresses this issue.

According to an embodiment of the present invention, as shown in FIG. 2, the dielectric stack 40 has at least two adjacent dielectric films 401 and 403 with an interface 402 between the dielectric film 401 and the dielectric film 403. Moisture or stress may penetrate into the RF circuit region 11 through the interface or boundary 402 between the dielectric film 401 and the dielectric film 403, causing corrosion or damage to the circuit structure. According to an embodiment of the present invention, the two adjacent dielectric films 401 and 403 may be two adjacent low-k dielectric films.

According to an embodiment of the invention, the sealing ring 30 is composed of interconnected metal lines M and vias V. For the sake of simplicity, only the first metal layer M1, the second metal layer M2 and the first via layer V1 between the first metal layer M1 and the second metal layer M2 are shown in FIG. 2. According to an embodiment of the present invention, the second metal layer M2 may be the topmost copper metal layer, for example, the topmost damascened copper metal layer. In this exemplary embodiment, the second metal layer M2 and the first via layer V1 are interconnected structures formed by a dual damascene copper process, and there will be no copper interconnects above the second metal layer M2.

According to an embodiment of the invention, the sealing ring 30 is electrically coupled to the lower substrate 101 via a through contact TV penetrating the device layer 103 and the buried oxide layer 102. According to an embodiment of the invention, the through contact TV penetrates through the trench isolation region ST provided in the device layer 103. According to an embodiment of the invention, after completing the chemical mechanical polishing (CMP) process of the second metal layer M2, a cap layer 404 such as a silicon nitride layer, silicon oxynitride layer, or silicon carbide layer may be deposited on the second metal layer M2 and the dielectric film 403.

According to an embodiment of the invention, the RF circuit region 11 comprises a metal-insulator-metal (MIM) capacitor 110. According to an embodiment of the invention, for example, the MIM capacitor 110 comprises a capacitor bottom metal (CBM) layer 111 and a capacitor top metal (CTM) layer 112. According to an embodiment of the invention, for example, the CBM layer 111 is coplanar with the second metal layer M2. According to an embodiment of the invention, for example, the CTM layer 112 may be a titanium or titanium nitride layer, but is not limited thereto.

The cap layer 404 is interposed between the CBM layer 111 and the CTM layer 112 and functions as the capacitor dielectric layer.

Figure 3:
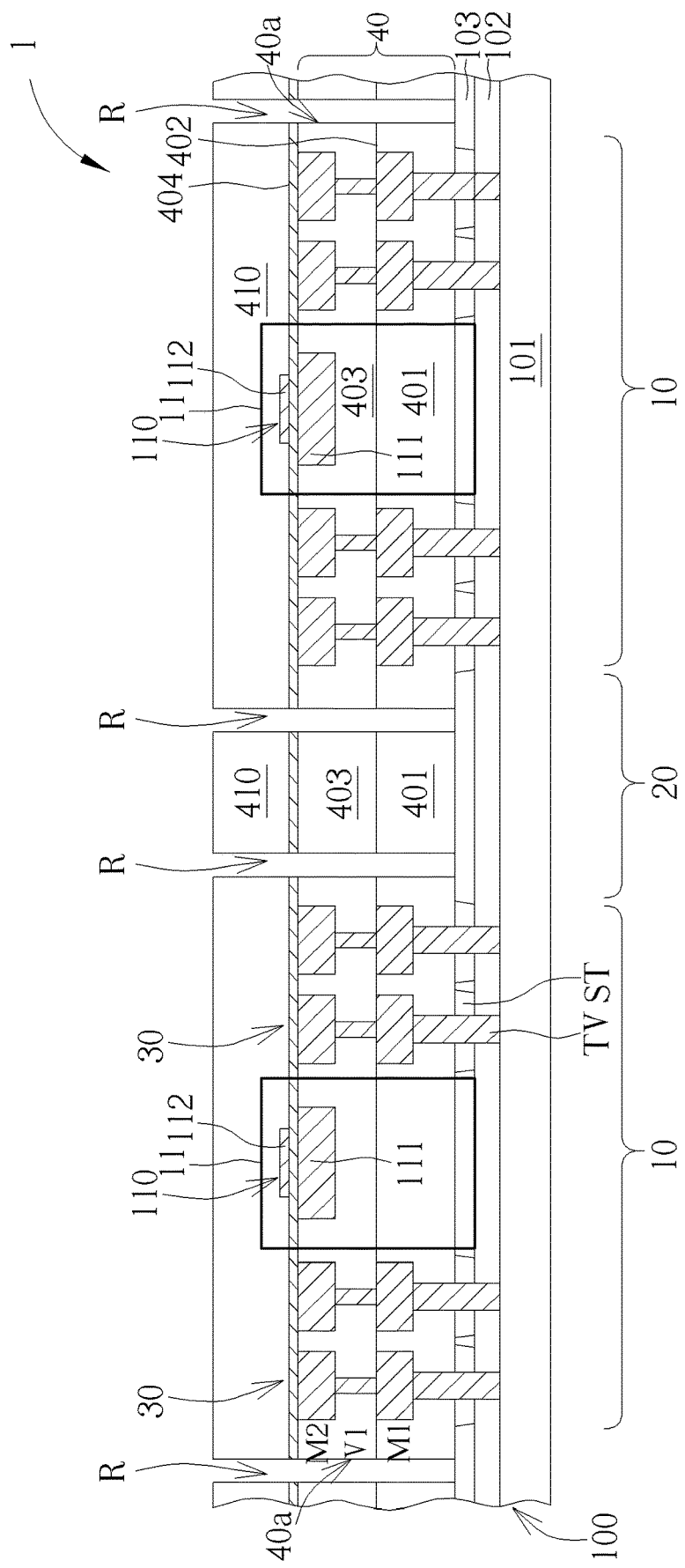

As shown in FIG. 3, a patterned photoresist layer 410 is then formed on the second metal layer M2 and the dielectric film 403. According to an embodiment of the invention, the patterned photoresist layer 410 covers the integrated circuit area 10 and partially exposes the scribe line area 20. Next, an anisotropic dry etching process is performed to etch away the dielectric stack 40 that is not covered by the patterned photoresist layer 410, partially revealing the device layer 103 in the scribe line area 20, thereby forming at least one annular trench R in the scribe line area 20 around the periphery of the seal ring 30. The trench R may have a width of about 1-5 micrometers depending upon the aspect ratio of the metal stack of the seal ring 30. According to an embodiment of the invention, the trench R surrounds the seal ring 30, and the trench R exposes a sidewall 40a of the dielectric stack 40 and the interface or boundary 402 between the dielectric film 401 and the dielectric film 403 on the sidewall 40a.

Figure 4:
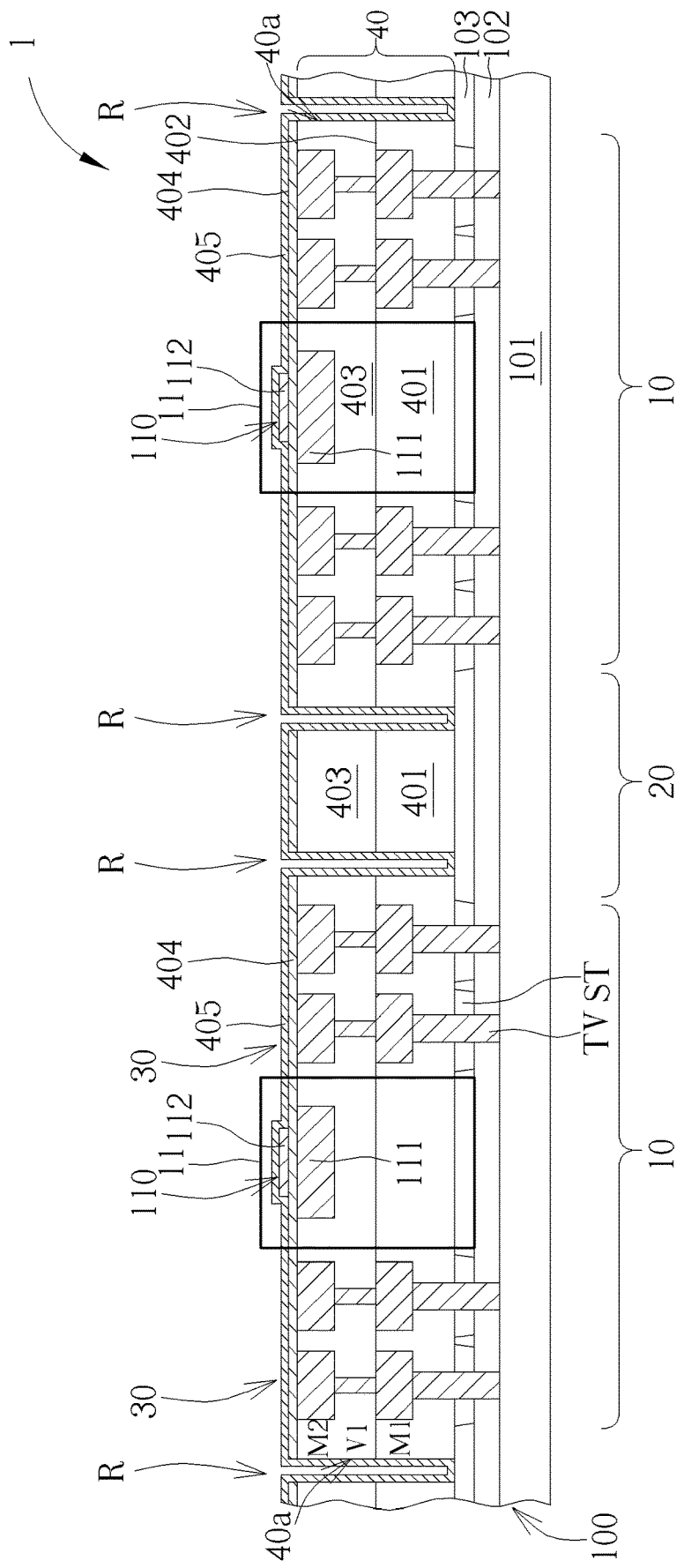

As shown in FIG. 4, subsequently, the remaining photoresist layer 410 is stripped off. At this point, the cap layer 404 on the dielectric stack 40 is revealed. Next, a moisture blocking layer 405 is formed to continuously cover the integrated circuit area 10 and extend onto the sidewall 40a of the dielectric stack 40, thereby sealing the interface 402 between the dielectric films 401 and 403 of the dielectric stack 40. The moisture blocking layer 405 can effectively prevent moisture or contaminants from penetrating into the RF circuit region 11. According to an embodiment of the invention, the moisture blocking layer 405 may comprise silicon nitride, silicon oxynitride, or silicon carbonitride. According to an embodiment of the invention, the moisture blocking layer 405 not only covers the sidewall 40a of the dielectric stack 40, but also extends into the scribe line region 20 and covers the device layer 103.

Figure 5:
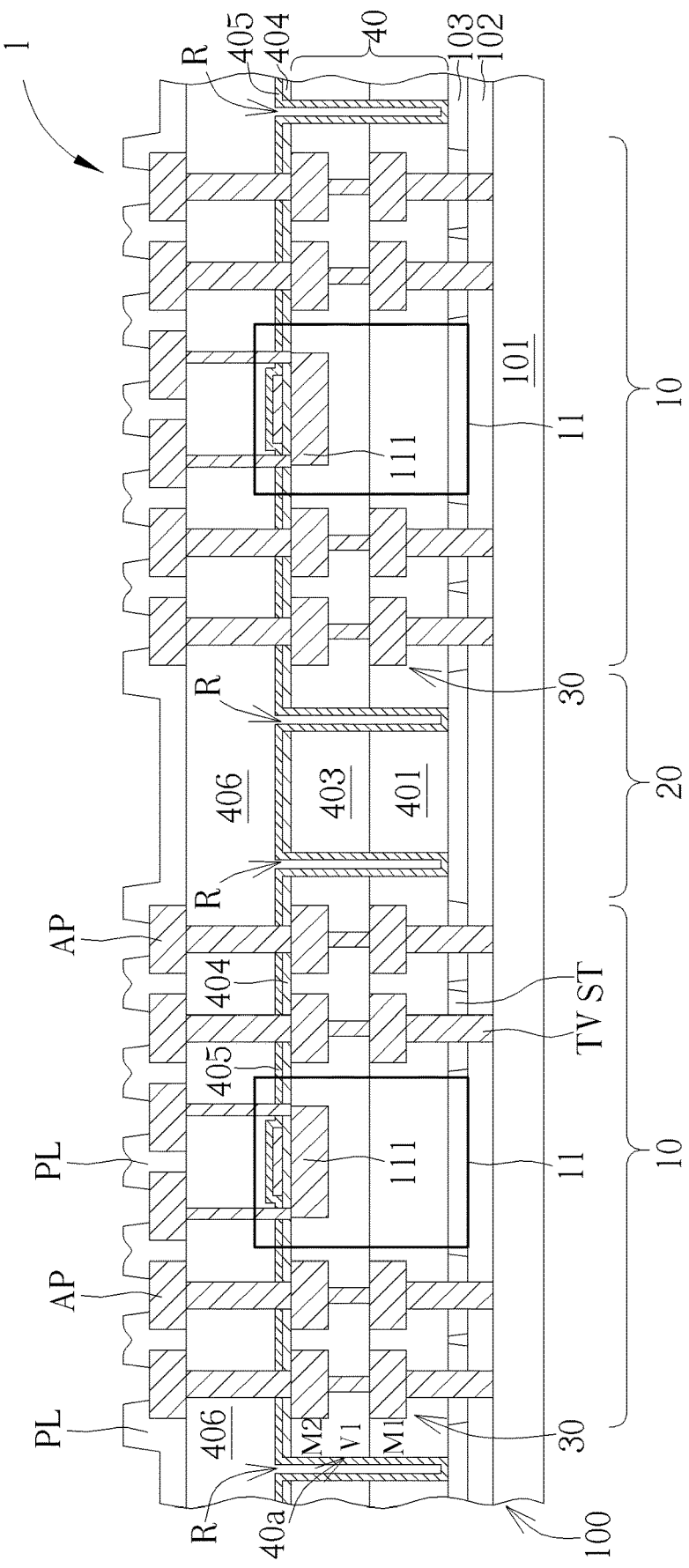

As shown in FIG. 5, next, a topmost inter-layer dielectric (ILD) film 406 is formed to cover the moisture barrier layer 405, the MIM capacitor 110, and the dielectric stack 40. The trench R may be completely filled with the topmost inter-layer dielectric (ILD) film 406 and the moisture barrier layer 405. According to an embodiment of the invention, the topmost ILD film 406 may comprise silicon oxide. Next, a topmost via layer Vn is formed in the topmost ILD film 406. The topmost via layer Vn penetrates through the topmost ILD film 406, the moisture blocking layer 405, and the cap layer 404 to electrically connect with the second metal layer M2. Next, an aluminum pad AP is formed on the topmost ILD film 406. The aluminum pad AP is disposed directly on the topmost via layer Vn, and is electrically connected to the topmost via layer Vn. Next, a passivation layer PL is deposited to cover the topmost ILD film 406 conformally. According to an embodiment of the present invention, the passivation layer PL may comprise polyimide, silicon nitride, or silicon oxide.

According to an embodiment of the present invention, the passivation layer PL covers the periphery of the aluminum pad AP and the top surface of the topmost ILD film 406. According to an embodiment of the present invention, a photolithography process and an etching process may be carried out to form an opening OB in the passivation layer PL, exposing a portion of the upper surface of the aluminum pad AP for subsequent connection with an external circuit.

As shown in FIG. 5, structurally, an integrated circuit device 1 includes a substrate 100 and an integrated circuit area 10 on the substrate 100. The integrated circuit area 10 includes a dielectric stack 40. A cap layer 404 is disposed on the dielectric stack 40. A seal ring 30 is disposed in the dielectric stack 40 and around a periphery of the integrated circuit area 10. A trench R is formed around the seal ring 30 to expose a sidewall 40a of the dielectric stack 40. A metal-insulator-metal (MIM) capacitor 110 including a capacitor top metal (CTM) layer 112 and a capacitor bottom metal (CBM) layer 111 is disposed on the dielectric stack 40. A moisture blocking layer 405 continuously covers the integrated circuit area 10 and the MIM capacitor 110. The cap layer 404 is interposed between the CTM layer 112 and the CBM layer 111 of the MIM capacitor 110 and functions as a capacitor dielectric layer of the MIM capacitor 110. The moisture blocking layer 405 extends to the sidewall 40a of the dielectric stack 40, thereby sealing a boundary 402 between two adjacent dielectric films 401, 403 in the dielectric stack 40. A passivation layer PL is disposed over the moisture blocking layer 405.

According to some embodiments, the integrated circuit area 10 comprises a radio-frequency (RF) circuit region 11.

According to some embodiments, the substrate is a silicon-on-insulator (SOI) substrate 100 comprising a lower substrate 101, a buried oxide layer 102 on the lower substrate 101, and a device layer 103 on the buried oxide layer 102.

According to some embodiments, the device layer 103 comprises a silicon layer.

According to some embodiments, the seal ring 30 is electrically coupled to the lower substrate 101 with a through contact TV that penetrates through the device layer 103 and the buried oxide layer 102.

According to some embodiments, the two adjacent dielectric films 401, 403 are two adjacent low-dielectric constant (low-k) dielectric films.

According to some embodiments, the seal ring 30 is a discontinuous seal ring.

According to some embodiments, the seal ring 30 is composed of interconnected metal lines and vias.

According to some embodiments, the metal lines comprise a topmost copper metal layer M2.

According to some embodiments, the topmost copper metal layer M2 is a topmost damascene copper layer, and the CBM layer 111 is coplanar with the topmost damascene copper layer M2.

According to some embodiments, the integrated circuit device 1 further comprises a topmost inter-layer dielectric (ILD) film 406 covering the moisture blocking layer 405 and the MIM capacitor 110; a topmost via layer Vn penetrating through the topmost ILD film 406 and the moisture blocking layer 405 to electrically connect with the topmost copper metal layer M2; and an aluminum pad AP disposed on and electrically connected to the topmost via layer Vn.

According to some embodiments, the passivation layer PL covers a periphery of the aluminum pad AP and a top surface of the topmost ILD film 406.

According to some embodiments, the topmost ILD film 406 comprises silicon oxide.

According to some embodiments, the passivation layer PL comprises polyimide or silicon oxide.

According to some embodiments, the moisture blocking layer 405 comprises silicon nitride, silicon oxynitride, or silicon carbonitride.

Figure 6:
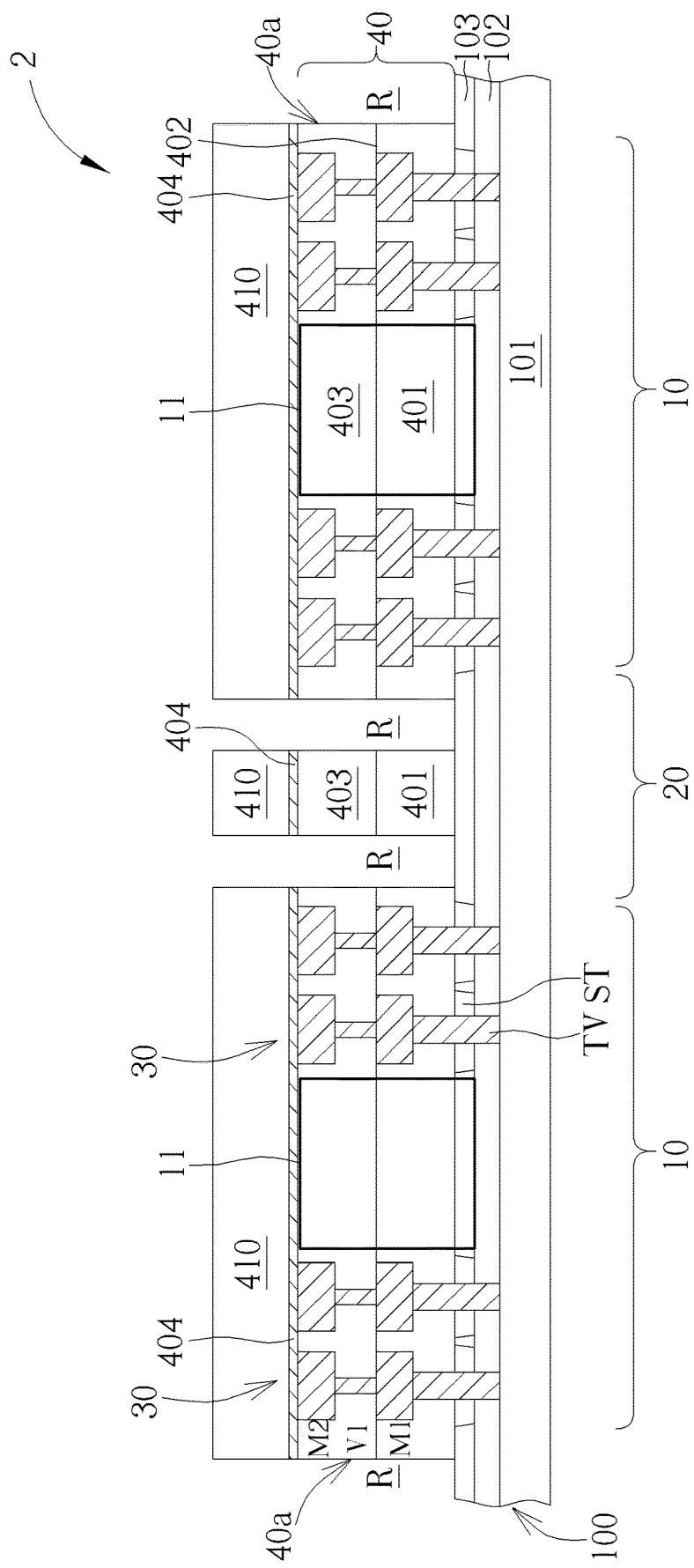
FIG. 6 to FIG. 9 are schematic, cross-sectional diagrams showing a method of fabricating an integrated circuit device with a seal ring according to another embodiment of the present invention.

Please refer to FIG. 6 to FIG. 9. FIG. 6 to FIG. 9 are schematic, cross-sectional diagrams showing a method of fabricating an integrated circuit device 2 with a seal ring according to another embodiment of the present invention. As shown in FIG. 6, likewise, after the deposition of the cap layer 404, a patterned photoresist layer 410 is formed on the second metal layer M2 and the dielectric film 403. According to an embodiment of the invention, the patterned photoresist layer 410 covers the integrated circuit area 10 and partially exposes the scribe line area 20. Next, an anisotropic dry etching process is performed to etch away the dielectric stack 40 that is not covered by the patterned photoresist layer 410, partially revealing the device layer 103 in the scribe line area 20, thereby forming at least one annular trench R in the scribe line area 20 around the periphery of the seal ring 30. The trench R may have a width of about 1-5 micrometers depending upon the aspect ratio of the metal stack of the seal ring 30. According to an embodiment of the invention, the trench R surrounds the seal ring 30, and the trench R exposes a sidewall 40a of the dielectric stack 40 and the interface or boundary 402 between the dielectric film 401 and the dielectric film 403 on the sidewall 40a.

Figure 7:
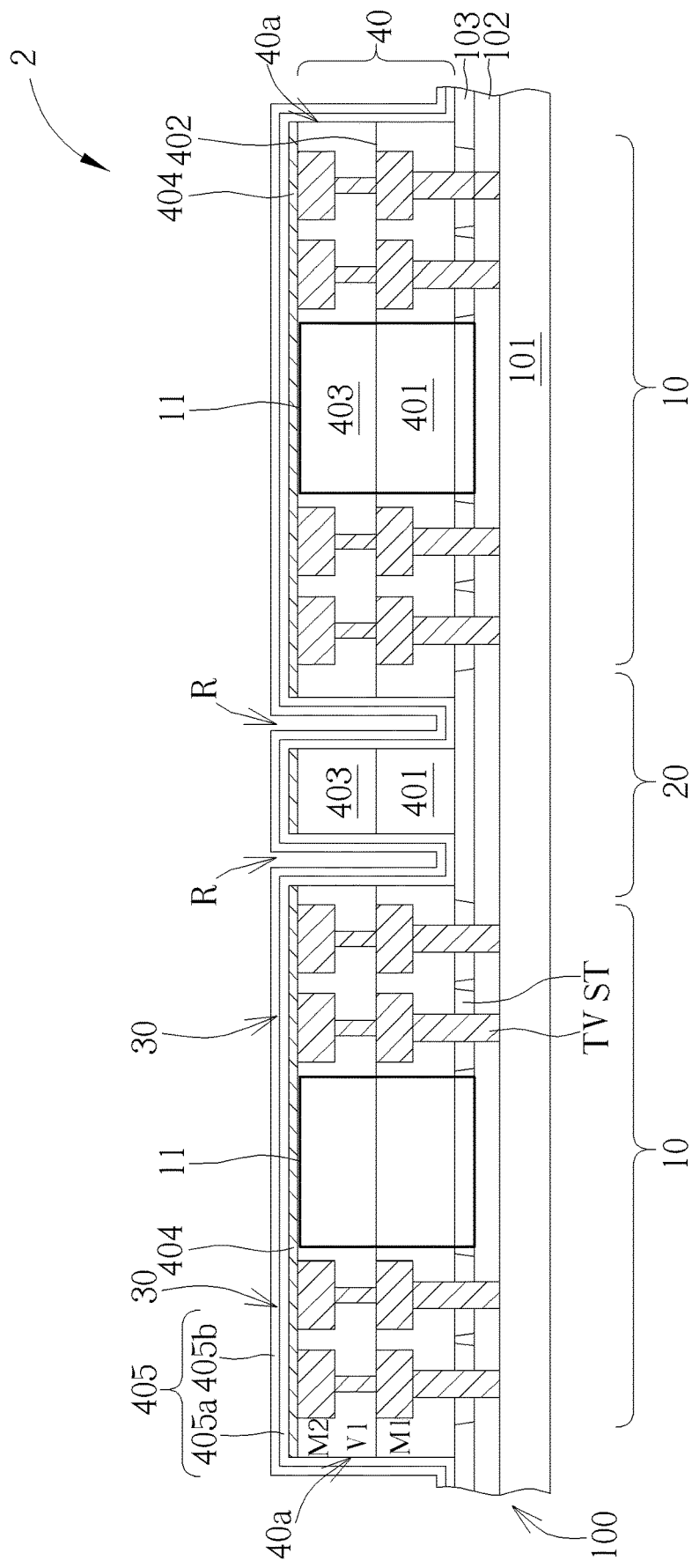

As shown in FIG. 7, subsequently, the remaining photoresist layer 410 is stripped off. At this point, the cap layer 404 on the dielectric stack 40 is revealed. Next, a moisture blocking layer 405 is formed to continuously cover the integrated circuit area 10 and extend onto the sidewall 40a of the dielectric stack 40, thereby sealing the interface 402 between the dielectric films 401 and 403 of the dielectric stack 40. The moisture blocking layer 405 can effectively prevent moisture or contaminants from penetrating into the RF circuit region 11. According to an embodiment of the invention, the moisture blocking layer 405 may comprise silicon nitride, silicon oxynitride, or silicon carbonitride. According to an embodiment of the invention, the moisture blocking layer 405 is a composite layer comprising a silicon oxide layer 405a and a silicon nitride layer 405b on the silicon oxide layer 405a. According to an embodiment of the invention, the moisture blocking layer 405 not only covers the sidewall 40a of the dielectric stack 40, but also extends into the scribe line region 20 and covers the device layer 103.

Figure 8:
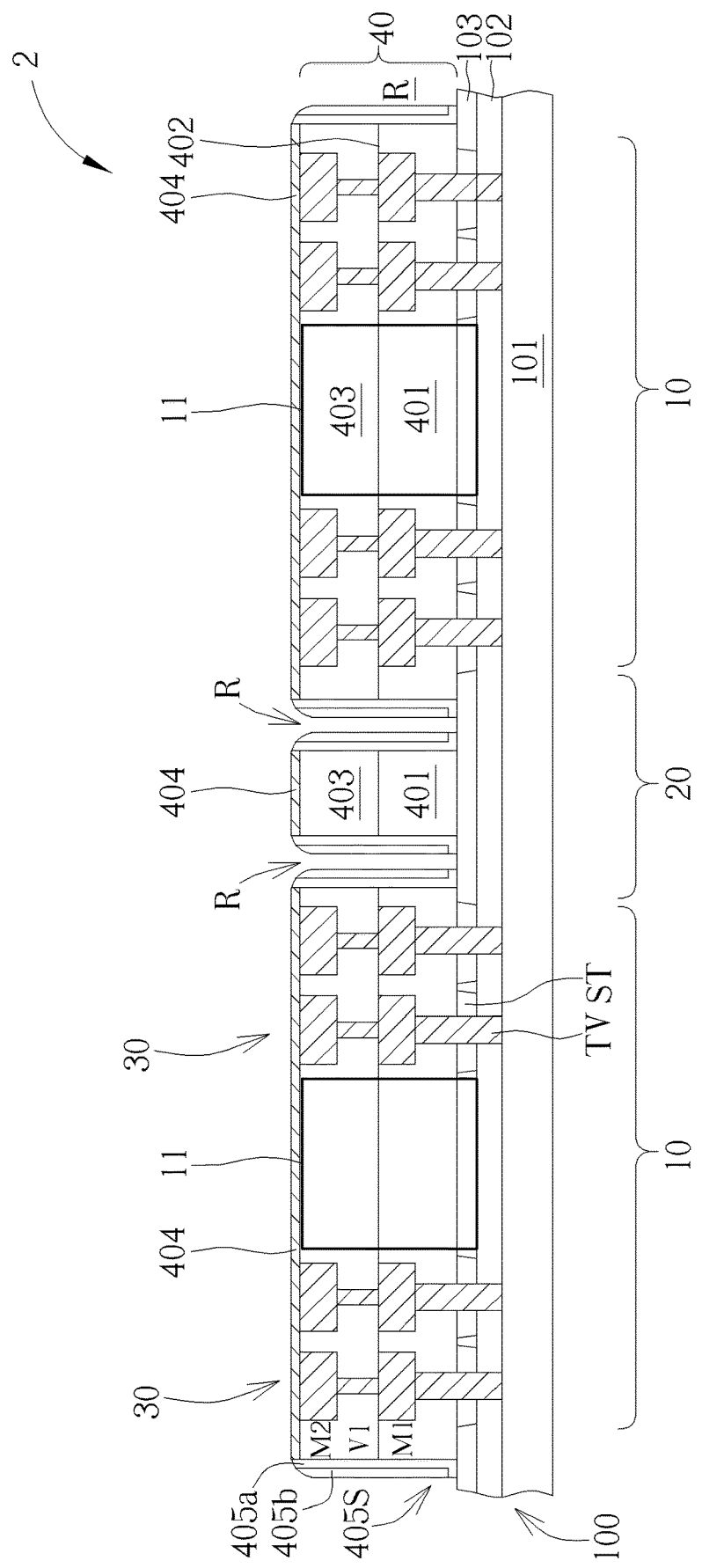

As shown in FIG. 8, an anisotropical dry etching process may be performed to etch the moisture blocking layer 405 until the cap layer 404 on the dielectric stack 40 is revealed, thereby forming an annular, moisture-blocking spacer 405s around the seal ring 30. The moisture blocking spacer 405s covers the sidewall 40a of the dielectric stack 40.

Figure 9:
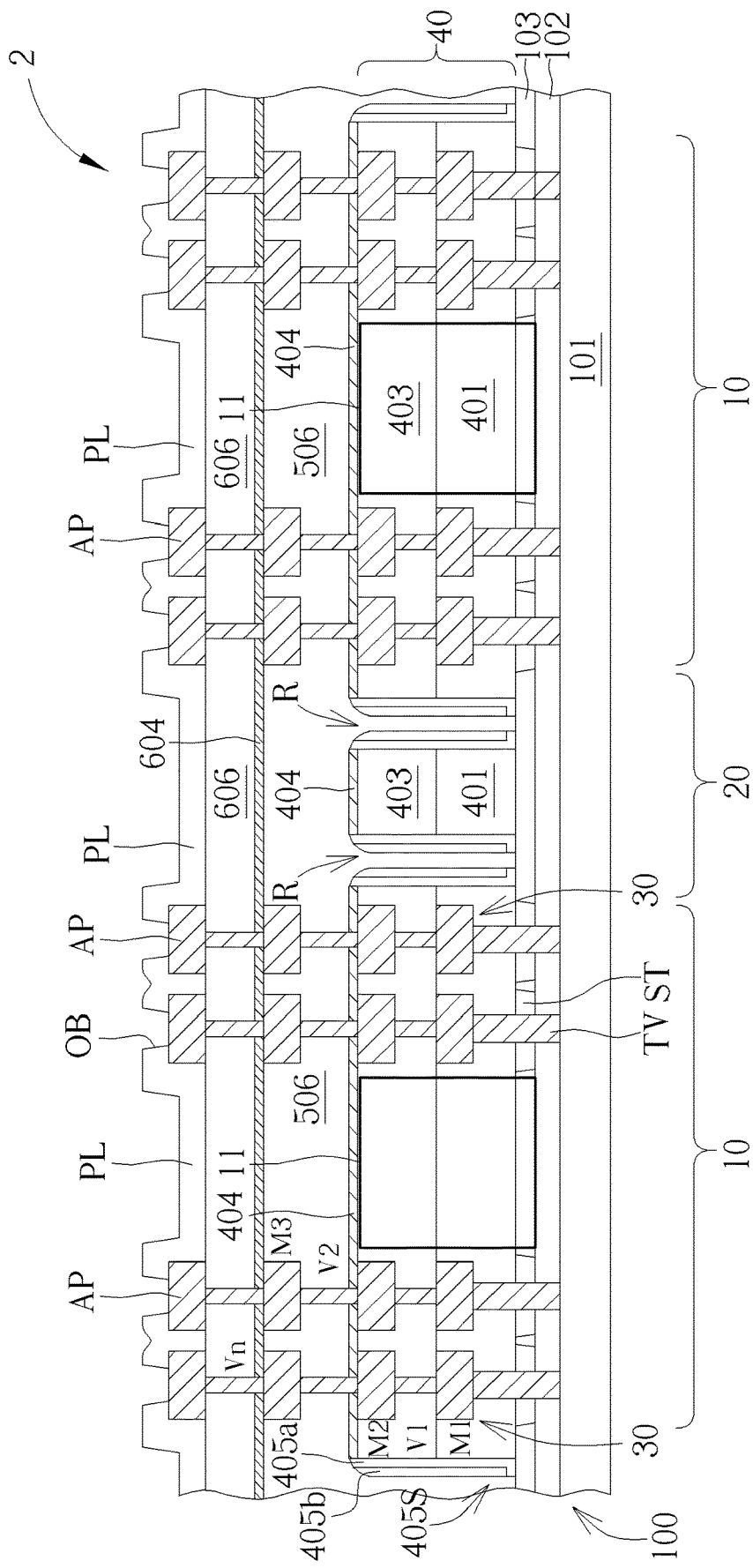

As shown in FIG. 9, next, an ILD film 506, such as a silicon oxide layer, tetraethylorthosilicate glass (TEOS) oxide layer or a fluorine-doped tetraethylorthosilicate glass (FTEOS) oxide layer, is formed to cover the cap layer 404 and the moisture barrier spacer 405s. The trench R may be completely filled with the ILD film 506 and the moisture barrier spacer 405s. A third metal layer M3 and a second via layer V2 are formed in the ILD film 506. The second via layer V2 penetrates the cap layer 404 and is coupled to the second metal layer M2. Another cap layer 604 such as a silicon nitride layer, a silicon oxynitride layer, or a silicon carbide layer may be formed on the third metal layer M3 and the ILD film 506.

Subsequently, a topmost ILD film 606 is formed to cover the cap layer 604. Next, a topmost via layer Vn is formed in the topmost ILD film 606. The topmost via layer Vn penetrates through the topmost ILD film 606 and the cap layer 604 to connect with the third metal layer M3. Next, an aluminum pad AP is formed on the topmost ILD film 606. The aluminum pad AP is disposed directly on the topmost via layer Vn, and is electrically connected to the topmost via layer Vn. Next, a passivation layer PL is deposited to cover the topmost ILD film 606 conformally. According to an embodiment of the present invention, the passivation layer PL may comprise polyimide, silicon nitride, or silicon oxide.

According to an embodiment of the present invention, the passivation layer PL covers the periphery of the aluminum pad AP and the top surface of the topmost ILD film 606. According to an embodiment of the present invention, a photolithography process and an etching process may be carried out to form an opening OB in the passivation layer PL, exposing a portion of the upper surface of the aluminum pad AP for subsequent connection with an external circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An integrated circuit device, comprising:
a substrate;
an integrated circuit area on the substrate, said integrated circuit area comprising a dielectric stack;
a cap layer on the dielectric stack;
a seal ring disposed in said dielectric stack and around a periphery of said integrated circuit area;
a trench around the seal ring and exposing a sidewall of said dielectric stack;
a metal-insulator-metal (MIM) capacitor comprising a capacitor top metal (CTM) layer and a capacitor bottom metal (CBM) layer disposed on said dielectric stack;
a moisture blocking layer continuously covering said integrated circuit area and said MIM capacitor, wherein said cap layer is interposed between said CTM layer and said CBM layer of said MIM capacitor and functions as a capacitor dielectric layer of said MIM capacitor, and wherein said moisture blocking layer extends to said sidewall of said dielectric stack, thereby sealing a boundary between two adjacent dielectric films in said dielectric stack; and
a passivation layer over said moisture blocking layer.

2. The integrated circuit device according to claim 1, wherein said integrated circuit area comprises a radio-frequency (RF) circuit region.

3. The integrated circuit device according to claim 1, wherein said substrate is a silicon-on-insulator (SOI) substrate comprising a lower substrate, a buried oxide layer on the lower substrate, and a device layer on the buried oxide layer.

4. The integrated circuit device according to claim 3, wherein said device layer comprises a silicon layer.

5. The integrated circuit device according to claim 3, wherein said seal ring is electrically coupled to said lower substrate with a through contact that penetrates through said device layer and said buried oxide layer.

6. The integrated circuit device according to claim 1, wherein said two adjacent dielectric films are two adjacent low-dielectric constant (low-k) dielectric films.

7. The integrated circuit device according to claim 1, wherein said seal ring is a discontinuous seal ring.

8. The integrated circuit device according to claim 7, wherein said seal ring is composed of interconnected metal lines and vias.

9. The integrated circuit device according to claim 8, wherein said metal lines comprise a topmost copper metal layer.

10. The integrated circuit device according to claim 9, wherein said topmost copper metal layer is a topmost damascene copper layer, and wherein said CBM layer is coplanar with the topmost damascene copper layer.

11. The integrated circuit device according to claim 10 further comprising:
a topmost inter-layer dielectric (ILD) film covering said moisture blocking layer and said MIM capacitor;
a topmost via layer penetrating through said topmost ILD film and said moisture blocking layer to electrically connect with said topmost copper metal layer; and
an aluminum pad disposed on and electrically connected to said topmost via layer.

12. The integrated circuit device according to claim 11, wherein said passivation layer covers a periphery of said aluminum pad and a top surface of said topmost ILD film.

13. The integrated circuit device according to claim 12, wherein said topmost ILD film comprises silicon oxide.

14. The integrated circuit device according to claim 12, wherein said passivation layer comprises polyimide or silicon oxide.

15. The integrated circuit device according to claim 1, wherein said moisture blocking layer comprises silicon nitride, silicon oxynitride, or silicon carbonitride.

16. An integrated circuit device, comprising:
a substrate;
an integrated circuit area on said substrate, said integrated circuit area comprising a dielectric stack;
a seal ring disposed in said dielectric stack and around a periphery of said integrated circuit area;
a trench around said seal ring and exposing a sidewall of said dielectric stack, wherein said trench is disposed within a scribe line; and
a moisture blocking layer on said sidewall of said dielectric stack, thereby sealing a boundary between two adjacent dielectric films in said dielectric stack, wherein said moisture blocking layer is a composite layer comprising a silicon oxide layer and a silicon nitride layer on the silicon oxide layer.

17. The integrated circuit device according to claim 16, wherein said integrated circuit area comprises a radio-frequency (RF) circuit.

18. The integrated circuit device according to claim 16, wherein said substrate is a silicon-on-insulator (SOI) substrate comprising a lower substrate, a buried oxide layer on the lower substrate, and a device layer on the buried oxide layer.

19. The integrated circuit device according to claim 18, wherein said device layer comprises a silicon layer.

20. The integrated circuit device according to claim 18, wherein said seal ring is electrically coupled to said lower substrate with a through contact that penetrates through said device layer and said buried oxide layer.

21. The integrated circuit device according to claim 16, wherein said two adjacent dielectric films are two adjacent low-dielectric constant (low-k) dielectric films.

22. The integrated circuit device according to claim 16, wherein said seal ring is a discontinuous seal ring.

23. The integrated circuit device according to claim 22, wherein said seal ring is composed of interconnected metal lines and vias.

24. The integrated circuit device according to claim 23, wherein said metal lines comprise a topmost copper metal line.

25. The integrated circuit device according to claim 24, wherein said topmost copper metal line is a topmost damascene copper layer.

26. The integrated circuit device according to claim 25 further comprising:
a topmost dielectric film over said dielectric stack;
a topmost via layer penetrating through said topmost dielectric film to electrically connect with said topmost copper metal layer; and
an aluminum pad disposed on and electrically connected to said topmost via layer.

27. The integrated circuit device according to claim 26 further comprising:
a passivation layer covering a periphery of said aluminum pad and a top surface of said topmost dielectric film.

28. The integrated circuit device according to claim 27, wherein said topmost dielectric film comprises silicon oxide.

29. The integrated circuit device according to claim 27, wherein said passivation layer comprises polyimide or silicon oxide.

* * * * *